(12) United States Patent
Yang et al.

(10) Patent No.: US 7,808,852 B2
(45) Date of Patent: Oct. 5, 2010

(54) SEMICONDUCTOR MEMORY DEVICE AND LAYOUT METHOD THEREOF

(75) Inventors: Hyang-Ja Yang, Suwon-si (KR); Wol-Jin Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 12/230,570

(22) Filed: Sep. 2, 2008

(65) Prior Publication Data
US 2009/0059687 A1 Mar. 5, 2009

(30) Foreign Application Priority Data
Aug. 31, 2007 (KR) .................. 10-2007-0088361

(51) Int. Cl.
*G11C 7/00* (2006.01)
(52) U.S. Cl. .................. 365/203; 365/63; 365/189.11; 365/205
(58) Field of Classification Search .................. 365/63, 365/189.11, 203, 205
See application file for complete search history.

(56) References Cited

U.S. PATENT DOCUMENTS

| 6,765,833 | B2 | 7/2004 | Khang |
| 6,816,416 | B2 | 11/2004 | Won |
| 7,193,912 | B2 | 3/2007 | Obara et al. |
| 2007/0147160 | A1* | 6/2007 | Hanzawa et al. ........ 365/230.03 |
| 2007/0263465 | A1* | 11/2007 | Lee ............................ 365/203 |
| 2007/0280018 | A1* | 12/2007 | Lee et al. ................... 365/203 |

FOREIGN PATENT DOCUMENTS

| JP | 2005-340367 | 12/2005 |
| KR | 10-0413774 | 12/2003 |
| KR | 10-0434510 | 5/2004 |
| KR | 10-2006-0048072 | 5/2006 |

OTHER PUBLICATIONS

Abstract of Korean Patent Publication No. 1020040014742 published Feb. 18, 2004.
Abstract of Korean Patent Publication No. 1020030069653 published Aug. 27, 2003.

* cited by examiner

*Primary Examiner*—Hoai V Ho
(74) *Attorney, Agent, or Firm*—Harness, Dickey & Pierce, P.L.C.

(57) ABSTRACT

Example embodiments relate to a semiconductor memory device, for example, a semiconductor memory device including an efficient layout circuit and method thereof. The method may include sharing a first active area between a first precharger and a second precharger and sharing a second active area between a third precharger and a fourth precharger. The semiconductor memory device may include a level shifter configured to receive a first precharge control signal and boost a logic high level of the first precharge control signal to an external power supply voltage level to output a boosted first precharge control signal. The semiconductor memory device may further include first, second, third and fourth prechargers. The first and third prechargers may be configured to precharge data signals transmitted to a first and second pair of local input/output data lines to the first precharge voltage in response to the boosted first precharge control signal during a data read operation.

24 Claims, 7 Drawing Sheets

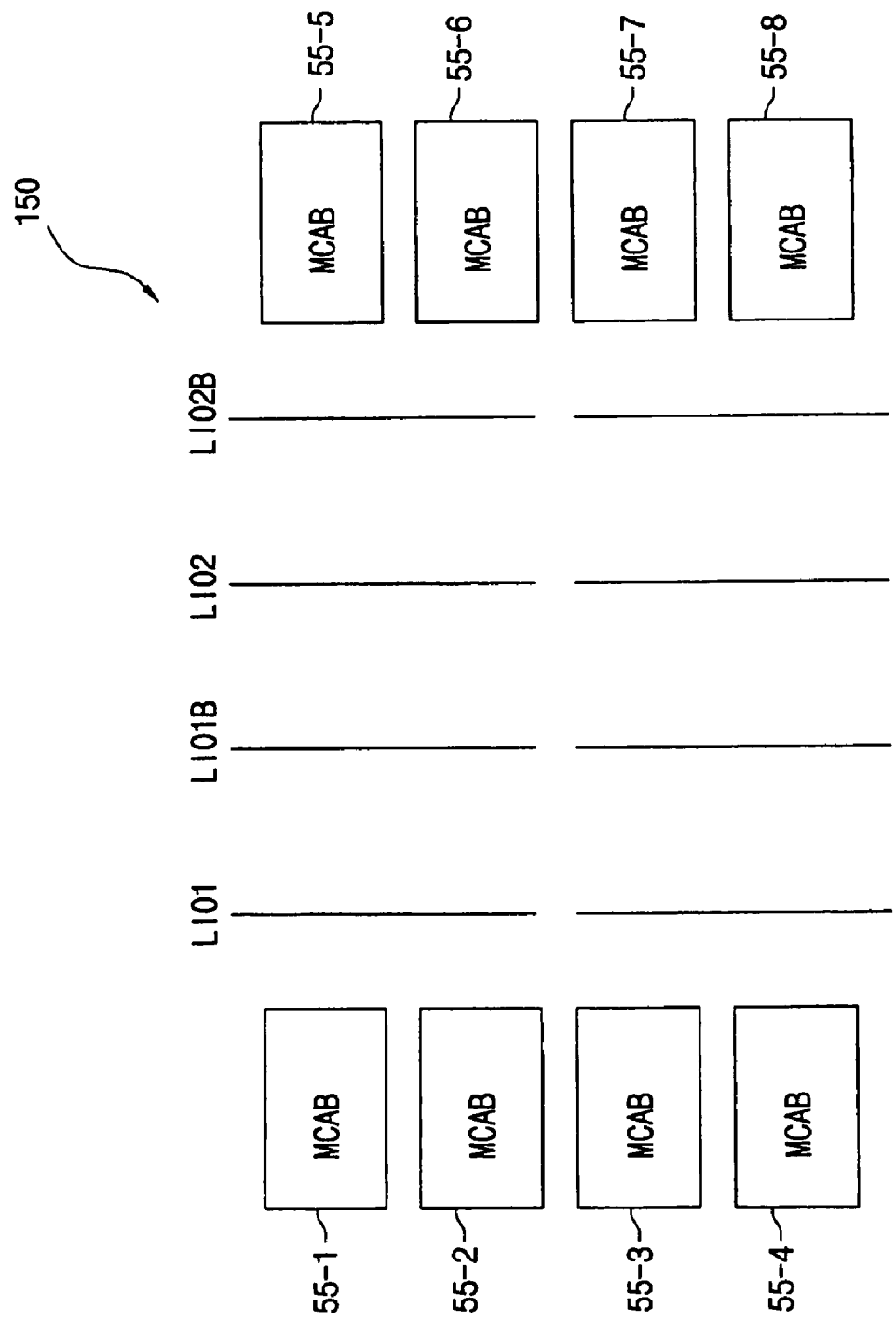

SEMICONDUCTOR MEMORY DEVICE AND LAYOUT METHOD THEREOF

PRIORITY STATEMENT

This U.S. non-provisional patent application claims the benefit of Korean Patent Application No. 2007-88361, filed on Aug. 31, 2007, the disclosure of which is incorporated herein in its entirety by reference.

BACKGROUND

1. Field

Example embodiments relate to a semiconductor memory device, for example, a semiconductor memory device including an efficient layout circuit and method thereof.

2. Description of Related Art

In semiconductor memory devices, a chip size may affect the competitiveness of products. Thus, a vast amount of research has been conducted on reducing the chip size. Downscaling a circuit linewidth and providing an optimal circuit layout may be important to reduce the chip size.

In recent years, an increase in the integration density of semiconductor memory devices has led to not only power reduction and performance improvement but also a reduction in the fabrication cost of the semiconductor memory devices. Thus, semiconductor manufacturers are concentrating their efforts on increasing yield per wafer by reducing a cell size and a memory core area.

That is, as the integration degree and operating performance of semiconductor memory devices increase, areas occupied by memory cores may also increase. Therefore, efficiently reducing a memory core area to strengthen the cost competitiveness of semiconductor memory devices may be important.

FIG. 1A is a partial block diagram of a conventional semiconductor memory device 100.

Referring to FIG. 1A, the conventional semiconductor memory device 100 may include a plurality of memory cell array blocks 5-1 to 5-16, a plurality of pairs of local input/output data lines (LIO1, LIO1B) and (LIO2, LIO2B), a plurality of bit line sense amplifiers 10-1 to 10-4, a plurality of first prechargers (or precharge circuits) 60-1 to 60-4, a plurality of second prechargers (or precharge circuits) 70-1 to 70-4, and a plurality of local input/output sense amplifiers 80-1 to 80-4.

Referring to FIG. 1A, the pairs of local input/output data lines (LIO1, LIO1B) and (LIO2, LIO2B) may be connected to the bit line sense amplifiers 10-1 to 10-4, the first prechargers 60-1 to 60-4, the second prechargers 70-1 to 70-4, and the local input/output sense amplifiers 80-1 to 80-4. The bit line sense amplifiers 10-1 to 10-4, the first prechargers 60-1 to 60-4, the second prechargers 70-1 to 70-4, and the local input/output sense amplifiers 80-1 to 80-4 may be sufficiently arranged in a region among the memory cell array blocks 5-1 to 5-16.

FIG. 1B is a partial block diagram of another conventional semiconductor memory device 150. The conventional semiconductor memory device 150 may have a smaller number of memory cell array blocks than the conventional semiconductor memory device 100 shown in FIG. 1A.

Referring to FIG. 1B, the conventional semiconductor memory device 150 may include a reduced number of memory cell array blocks 55-1 to 55-8. The number of memory cell array blocks may be reduced in order to decrease a memory core area. A region among the memory cell array blocks 55-1 to 55-8 may be approximately one half or less than the region among the memory cell array blocks 5-1 to 5-16 of the semiconductor memory device 100 shown in FIG. 1A. In other words, the number of memory cell array blocks 55-1 to 55-8 of FIG. 1B and a length of the pairs of local input/output data lines (LIO1, LIO1B) and (LIO2, LIO2B) may be reduced by approximately half, as compared with the semiconductor memory device 100 in FIG. 1A. As a result, arranging the bit line sense amplifiers 10-1 to 10-4, the first prechargers 60-1 to 60-4, the second prechargers 70-1 to 70-4, and the local input/output sense amplifiers 80-1 to 80-4 of FIG. 1A in the reduced region of FIG. 1B may be difficult.

FIG. 2 is a partial block diagram of a conventional semiconductor memory device 200.

Referring to FIG. 2, the conventional semiconductor memory device 200 may include a plurality of bit line sense amplifiers 10-1 and 10-2, a control signal generator 30, a first precharge voltage generator 40, a second precharge voltage generator 50, a plurality of first prechargers 60-1 and 60-2, a plurality of second prechargers 70-1 and 70-2, and a plurality of local input/output sense amplifiers 80-1 and 80-2. The control signal generator 30 may generate a first precharge control signal C1 and a second precharge control signal P1

The first precharger 60-1 may be connected between the pair of local input/output data lines LIO1 and LIO1B. The first precharger 60-1 may include precharge transistors Q_N1 and Q_N2 and an equalization transistor Q_N3. The precharge transistors Q_N1 and Q_N2 and the equalization transistor Q_N3 may include a thin gate insulating layer.

In the first precharger 60-1, a drain of the precharge transistor Q_N1 may be connected to the local input/output data line LIO1 and a drain of the precharge transistor Q_N2 may be connected to the local input/output data bar line LIOB. A source of the precharge transistor Q_N1 may be connected to a source of the precharge transistor Q_N2 such that a first precharge voltage VINT may be commonly applied to the sources of the precharge transistors Q_N1 and Q_N2. Gates of the transistors Q_N1 to Q_N3 may be commonly connected and controlled in response to the first precharge control signal C1.

In the first precharger 60-1, a source of the equalization transistor Q_N3 may be connected to the local input/output data line LIO1 and a drain of the equalization transistor Q_N3 may be connected to the local input/output data bar line LIO1B.

The second precharger 70-1 may also be connected between the pair of local input/output data lines LIO1 and LIO1B. The second precharger 70-1 may include precharge transistors Q_K1 and Q_K2 and an equalization transistor Q_K3. The precharge transistors Q_K1 and Q_K2 and the equalization transistor Q_K3 may include a thick gate insulating layer. A drain of the precharge transistor Q_K1 may be connected to the local input/output data line LIO1 and a drain of the precharge transistor Q_K2 may be connected to the local input/output data bar line LIO1B. A source of the precharge transistor Q_K1 may be connected to a source of the precharge transistor Q_K2 such that a second precharge voltage VBL may be commonly applied to the sources of the precharge transistors Q_K1 and Q_K2.

In the second precharger 70-1, a source of the equalization transistor Q_K3 may be connected to the local input/output data line LIO1, and a drain of the equalization transistor Q_K3 may be connected to the local input/output data bar line LIO1B. Gates of the transistors Q_K1 to Q_K3 may be commonly connected and controlled in response to the second precharge control signal P1.

The second precharge voltage VBL may be an external voltage level. The first precharge voltage VINT may be an internal power supply voltage level. The second precharge voltage VBL may be approximately ½ of the internal power supply voltage level.

The details of the bit line sense amplifier 10-2, the first and second prechargers 60-2 and 70-2 and the local input/output sense amplifier 80-2 are similar to the bit line sense amplifier 10-1, the first and second prechargers 60-1 and 70-1 and the local input/output sense amplifier 80-1, and are omitted for the sake of brevity.

A conventional operation of the conventional semiconductor memory device 200 will now be described with reference to FIG. 2.

When a memory cell receives an enabled word line signal and outputs written/stored data to a pair of bit lines BL and BLB, the bit line sense amplifier 10-1 may receive charges stored in a capacitor of the memory cell through the pair of bit lines BL and BLB and may amplify a voltage corresponding to the charges.

The control signal generator 30 may receive external commands CMD and generate the first and second precharge control signals C1 and P1. The first and second precharge voltage generators 40 and 50 may receive an external power supply voltage VEXT and generate the first precharge voltage VINT and the second precharge voltage VBL, respectively.

The first precharger 60-1 may precharge data signals transmitted to the pair of local input/output data lines LIO1 and LIO1B to the first precharge voltage VINT in response to the first precharge control signal C1. For example, the precharge transistors Q_N1 and Q_N2 may be activated in response to the first precharge control signal C1 and may transmit the first precharge voltage VINT to the pair of local input/output data lines LIO1 and LIO1B. Also, the equalization transistor Q_N3 may be activated in response to the first precharge control signal C1 and may equalize the data signals transmitted to the pair of local input/output data lines LIO1 and LIO1B at the first precharge voltage VINT.

Thereafter, once precharge operation begins, the second precharger 70-1 may precharge the data signals transmitted to the pair of local input/output data lines LIO1 and LIO1B to the second precharge voltage VBL in response to the second precharge control signal P1.

For example, the precharge transistors Q_K1 and Q_K2 may be activated in response to the second precharge control signal P1 and may transmit the second precharge voltage VBL to the pair of local input/output data lines LIO1 and LIO1B. Also, the equalization transistor Q_K3 may be activated in response to the second precharge control signal P1 and may equalize the data signals transmitted to the pair of first local input/output data lines LIO1 and LIO1B at the second precharge voltage VBL.

The local input/output sense amplifier 80-1 may receive the equalized data signals from the pair of local input/output data lines LIO1 and LIO1B, may amplify voltage levels of the received signals, and may output the amplified signals to a pair of global data input/output data lines GIO1 and GIO1B.

FIGS. 3A through 3D illustrate conventional layouts of the plurality of first and second prechargers 60-1, 70-1, 60-2 and 70-2, respectively, of the conventional semiconductor memory devices 100 and 200 shown in FIGS. 1A and 2.

FIG. 3A illustrates a conventional layout of the first precharger 60-1 and the pair of local input/output data lines LIO1 and LIO1B shown in FIGS. 1A and 2.

Referring to FIG. 3A, the first precharger 60-1 may be interposed between a local input/output data line LIO1 and a local input/output data bar line LIO1B. An area interposed between the local input/output data line LIO1 and the local input/output data bar line LIO1B may include an active area, which is disposed at a lower level and divided into several sections. A first precharge control signal line C1 may be arranged on the active area. The local input/output data line LIO1, the local input/output data bar line LIO1B, and the first precharge voltage line VINT may be disposed at a higher level.

The active area may be electrically connected to the local input/output data line LIO1 by an input/output data line contact IO1C and electrically connected to the local input/output data bar line LIO1B by an input/output data bar line contact IOB1C. Also, the active area may be electrically connected to the first precharge voltage line VINT by a first precharge voltage data line contact VINTC.

Thus, the precharge transistor Q_N1 may be arranged between the local input/output data line contact IO1C and the local input/output data bar line contact IOB1C. The precharge transistor Q_N2 may be arranged between the local input/output data line contact IO1C and the first precharge voltage line contact VINTC. Also, the equalization transistor Q_N3 may be arranged between the local input/output data bar line contact IOB1C and the first precharge voltage line contact VINTC.

FIG. 3B illustrates a conventional layout of the second precharger 70-1 and the pair of local input/output data lines LIO1 and LIO1B shown in FIGS. 1A and 2.

Referring to FIG. 3B, the second precharger 70-1 may include an active area, which is disposed at the lower level and divided into several sections. A second precharge control signal line P1 may be arranged on the active area. A local input/output data line LIO1, a local input/output data bar line LIO1B, and a second precharge voltage line VBL may be disposed at a higher level.

Similarly, the active area may be electrically connected to the local input/output data line LIO1 by the input/output data line contact IO1C and electrically connected to the local input/output data bar line LIO1B by the input/output data bar line contact IOB1C. Also, the active area may be electrically connected to the second precharge voltage line VBL by a second precharge voltage line contact VBLC.

Thus, the precharge transistor Q_K1 may be arranged between the local input/output data line contact IO1C and the local input/output data bar line IOB1C. The precharge transistor Q_K2 may be arranged between the local input/output data line contact IO1C and the second precharge voltage line contact VBLC. Also, the equalization transistor Q_K3 may be arranged between the local input/output data bar line contact IOB1C and the second precharge voltage line contact VBLC.

FIGS. 3C and 3D illustrate a conventional layout of the first precharger 60-2, the second precharger 70-2, and the pair of local input/output data lines LIO2 and LIO2B shown in FIGS. 1A and 2. The prechargers 60-2 and 70-2 arranged between the local input/output data line LIO2 and local input/output data bar line LIO2B illustrated in FIGS. 3C and 3D are generally the same as the prechargers 60-1 and 70-1 except that the pair of local input/output data lines LIO1 and LIO1B are replaced by the pair of second local input/output data lines LIO2 and LIO2B.

Accordingly, in the conventional semiconductor memory devices as shown in FIGS. 3A-D, the first and second precharge control signal lines C1 and P1 connected to the pairs of local input/output data lines (LIO1, LIO1B) and (LIO2, LIO2B) may be separately arranged in different sections. Also, active areas in which the precharge transistors Q_N1, Q_N2, Q_K1, and Q_K2 of the first and second prechargers 60-1, 60-2, 70-1, and 70-2 are arranged may be separately arranged in different sections. Thus, increasing the integration density of conventional semiconductor memory devices may be difficult due to the conventional layout of the components.

Accordingly, if the number of memory cell array blocks is reduced as shown in FIG. 1B, arranging the bit line sense amplifiers 10-1 to 10-4, the first prechargers 60-1 to 60-4, the second prechargers 70-1 to 70-4, and the local input/output sense amplifiers 80-1 to 80-4 of FIG. 1A in the layout of FIG. 1B may be difficult.

SUMMARY

Example embodiments may provide a layout method of a semiconductor memory device. The method may include sharing a first active area between a first precharger and a second precharger and sharing a second active area between a third precharger and a fourth precharger. The first and third prechargers may be configured to precharge a first pair of local input/output data lines to a first precharge voltage in response to a first precharge control signal. The second and fourth prechargers may be configured to precharge a second pair of local input/output data lines to a second precharge voltage in response to a second precharge control signal.

The first and third prechargers may include a first and second precharge transistor and a first equalization transistor, and the second and fourth prechargers may include a third and fourth precharge transistor and a second equalization transistor.

The method may further include electrically connecting each of the first and second active areas to a local input/output data line of the first and second input/output data lines by an input/output data line contact, a local input/output data bar line of the first and second input/output data lines by input/output data bar line contact, a first precharge voltage line by a first precharge voltage line contact, and a second precharge voltage line by a second precharge voltage line contact.

Each of the sharing of the first and second active area may include arranging the second precharge transistor between the local input/output data line contact and the first precharge voltage line contact, and the fourth precharge transistor between the local input/output data line contact and the second precharge voltage line contact. The second and fourth precharge transistors may share the same local input/output data line contact.

The sharing of the first and second active area may further include arranging the first and third precharge transistors between the local input/output data line contact and the local input/output data bar line contact. The first and third precharge transistors may share the same local input/output data line contact.

The sharing of the first and second active area may further include arranging the first equalization transistor between the local input/output data bar line contact and the first precharge voltage line contact, and the second equalization transistor between the local input/output data bar line contact and the second precharge voltage line contact. The first and second equalization transistors may share the same local input/output data bar line contact.

The method may further include boosting the first precharge control signal to a boosted first precharge control signal. A level of the boosted first precharge control signal may be an external power supply voltage level.

The method may further include arranging the first precharge control signal on the first and second active area. The first precharge control signal may be extended to the first and third prechargers. The second precharge control signal may be arranged on the first and second active area. The second precharge control signal may be extended to the second and fourth prechargers.

The first and second equalization transistors and the first through fourth precharge transistors may include insulating layers of the same thickness.

According to example embodiments, a semiconductor memory device may include a level shifter configured to receive a first precharge control signal and boost a logic high level of the first precharge control signal to an external power supply voltage level to output a boosted first precharge control signal, first and third prechargers configured to receive a first precharge voltage and precharge data signals transmitted to a first and second pair of local input/output data lines to the first precharge voltage in response to the boosted first precharge control signal during a data read operation, and second and fourth prechargers configured to receive a second precharge voltage to precharge the data signals transmitted to the first and second pair of local input/output data lines to the second precharge voltage in response to a second precharge control signal during a precharge operation.

The semiconductor memory device may further include a control signal generator configured to receive commands to generate the first precharge control signal and the second precharge control signal, and a first and second precharge voltage generator configured to receive a power supply voltage and generate the first and second precharge voltages.

Each of the first and third prechargers may include first and second precharge transistors connected in series between the first and second pair of local input/output data lines, and a first equalization transistor. Each of the second and fourth prechargers may include third and fourth precharge transistors connected in series between the first and second pair of local input/output data lines and a second equalization transistor.

Each of the first and second precharge transistors may include a gate configured to receive the first boosted precharge control signal and a common source configured to receive the first precharge voltage.

Each of the third and fourth precharge transistors may include a gate configured to receive the second precharge control signal and a common source configured to receive the second precharge voltage.

The first equalization transistor may be configured to equalize the first precharge voltage on the first and second pair of local input/output data lines in response to receiving the booted first precharge control signal.

The second equalization transistor may be configured to equalize the second precharge voltage on the first and second pair of local input/output data lines in response to receiving the second precharge control signal.

The first precharge voltage may be an internal power supply voltage, and the second precharge voltage may be ½ the internal power supply voltage. A logic high level of the first precharge control signal may be a level of the internal power supply voltage, and a logic high level of the second precharge control signal may be a level of the external power supply voltage.

The semiconductor memory device may further include a plurality of bit line sense amplifiers configured to receive charges stored in a memory cell through a plurality of bit lines. The plurality of bit line sense amplifier may amplify a voltage corresponding to the charges to output the amplified voltage; and The semiconductor memory device may further include a plurality of local input/output sense amplifiers configured to receive the data signals transmitted to the first and second pairs of local input/output data lines during the data read operation and amplify voltage levels of the data signals to output the amplified data signals to pairs of first and second global input/output data lines.

BRIEF DESCRIPTION OF THE DRAWINGS

The above and other features and advantages will become more apparent by describing in detail example embodiments thereof with reference to the attached drawings in which:

FIG. 1B is a partial block diagram of another conventional semiconductor memory device;

DETAILED DESCRIPTION OF THE DRAWINGS

Figure 1A:
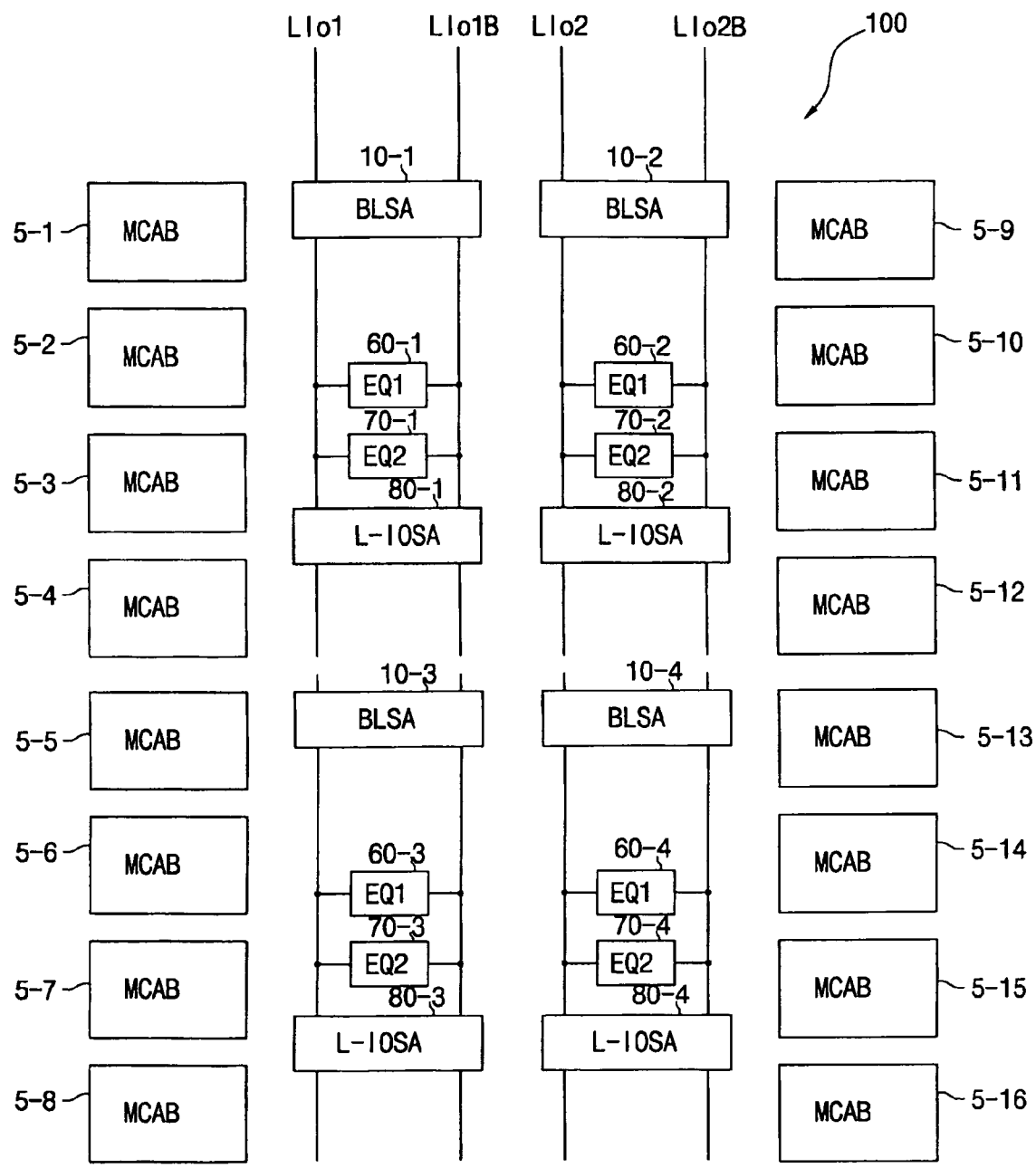
FIG. 1A is a partial block diagram of a conventional semiconductor memory device.
Figure 2:
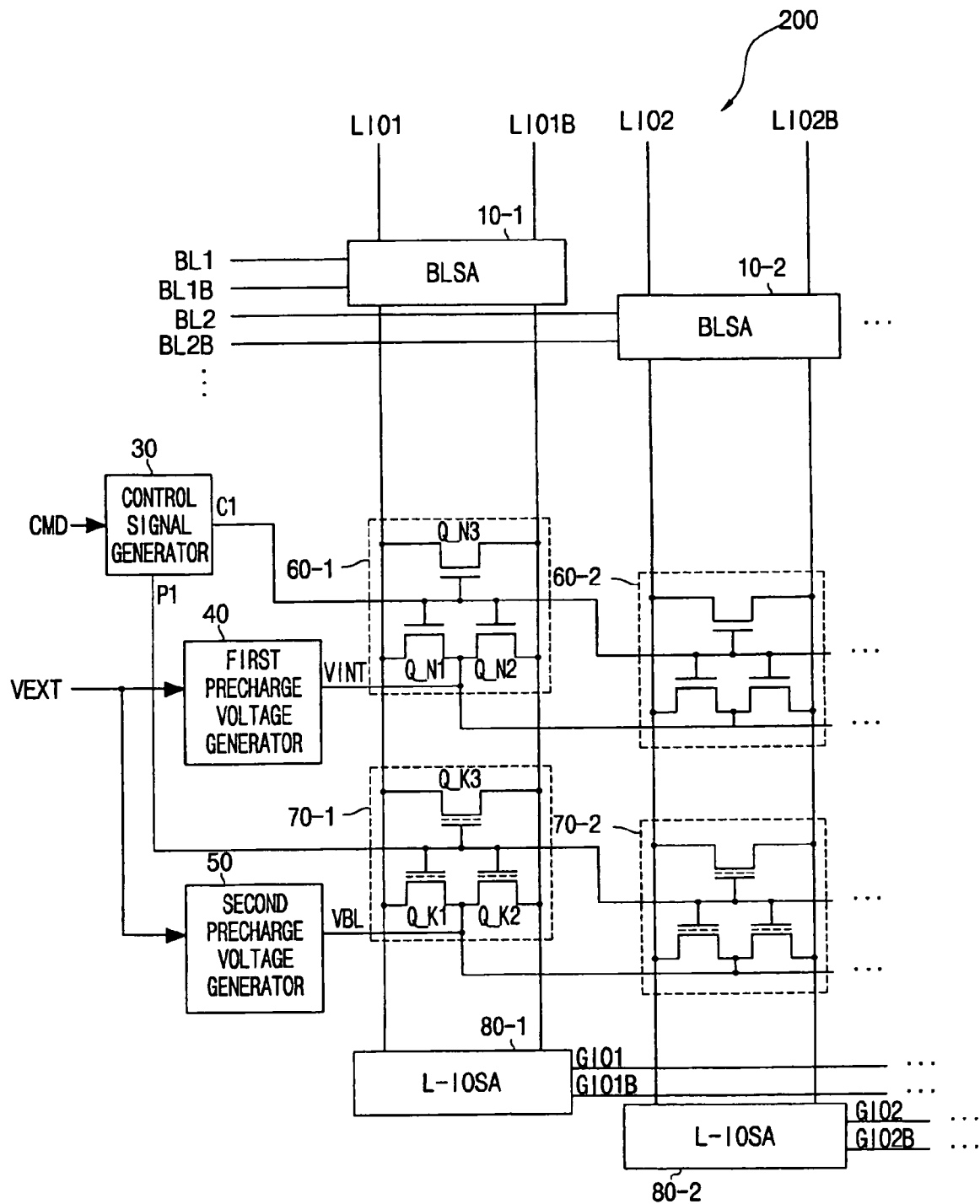
FIG. 2 is a partial block diagram of another conventional semiconductor memory device.
Figure 3A:
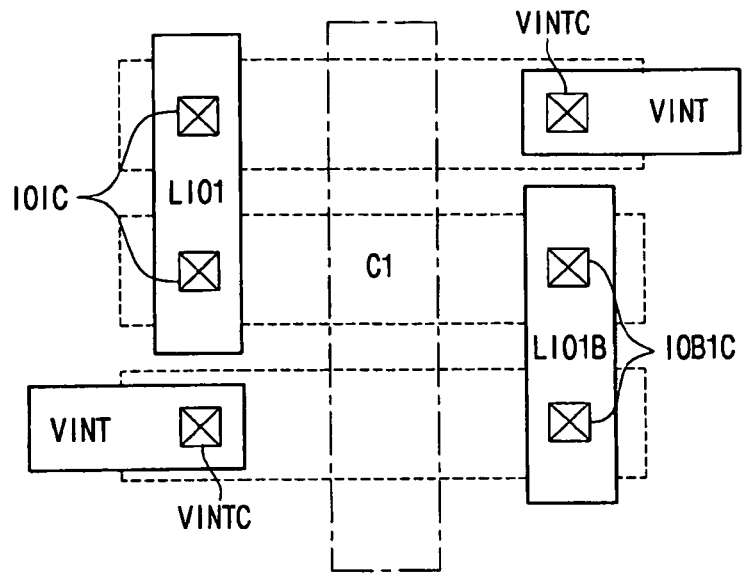
FIGS. 3A through 3D illustrate the layouts of first and second prechargers (or precharge circuits) of first and second local input/output data lines.
Figure 3B:
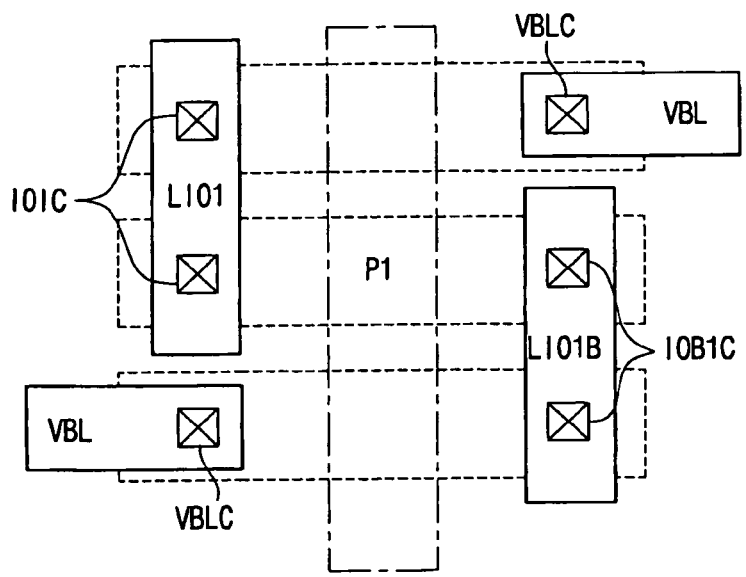
Figure 3C:
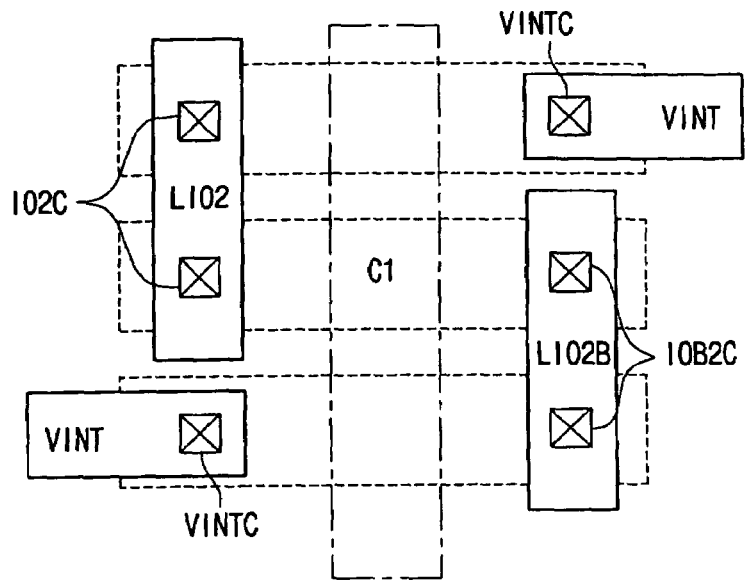
Figure 3D:
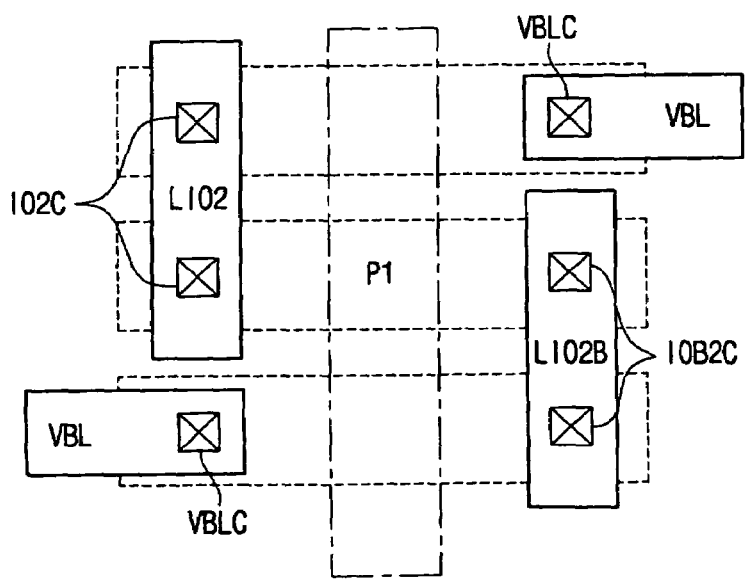

Example embodiments now will be described more fully with reference to the accompanying drawings, in which example embodiments are shown. The present application may, however, be embodied in many different forms and should not be construed as limited to the embodiments set forth herein. Rather, these example embodiments are provided so that this disclosure will be thorough and complete, and will fully convey the scope of the invention to those skilled in the art. Like reference numerals refer to like elements throughout this application.

It will be understood that, although the terms first, second, third, fourth and fifth may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
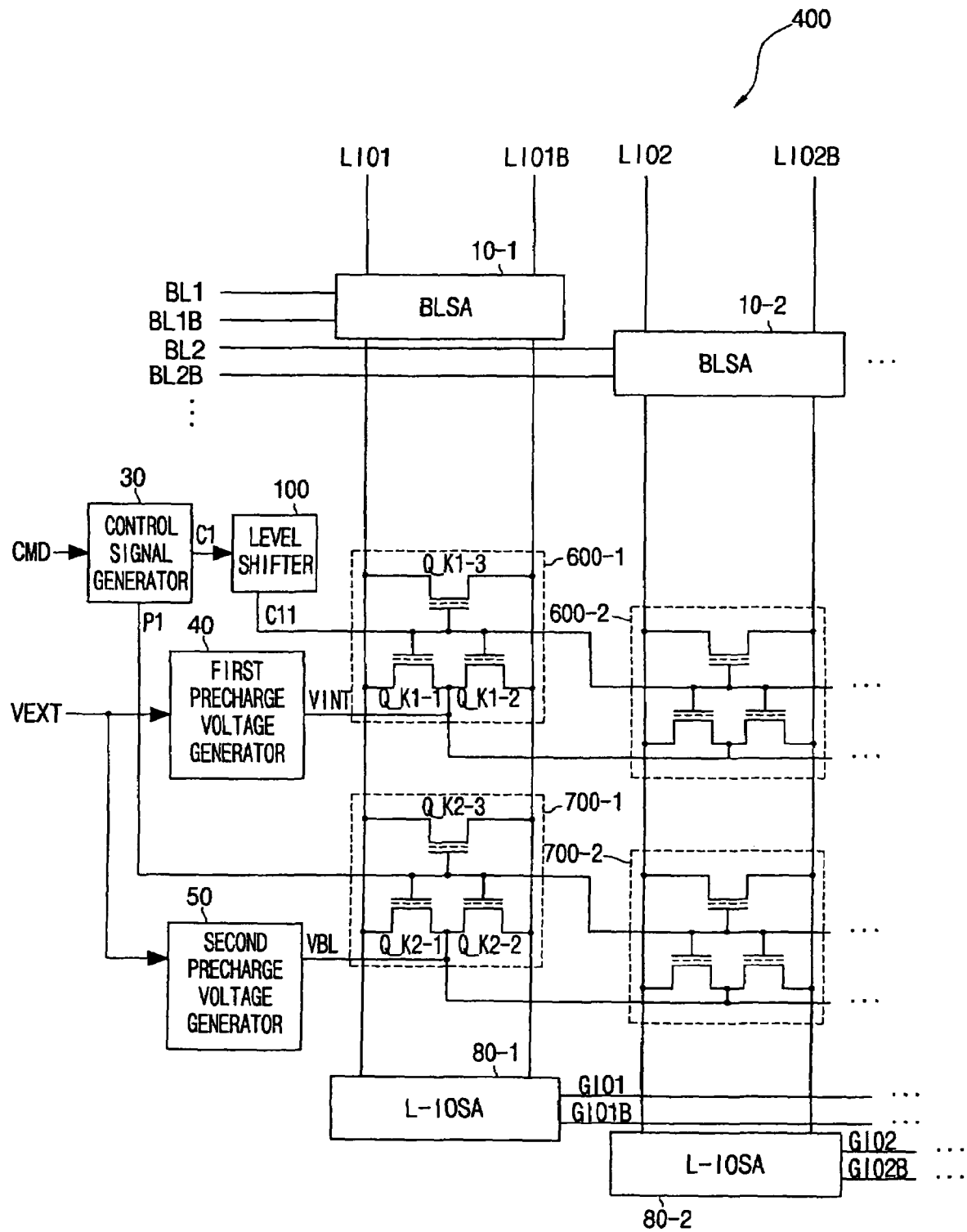
FIG. 4 is a partial block diagram of a semiconductor memory device according to example embodiments.

FIG. 4 is a partial block diagram of a semiconductor memory device 400 according to example embodiments.

Referring to FIG. 4, the semiconductor memory device 400 may include a plurality of bit line sense amplifiers 10-1 and 10-2, a control signal generator 30, a level shifter 100, first and second precharge voltage generators 40 and 50, a plurality of prechargers, and/or a plurality of local input/output sense amplifiers 80-1 and 80-2. The plurality of prechargers may include a first precharger 600-1, a second precharger 700-1, a third precharger 600-2, and a fourth precharger 700-2. The first and second prechargers 600-1 and 700-1 may be connected between a first pair of local input/output data lines (LIO1, LIO1B). The third and fourth prechargers 600-2 and 700-2 may be connected between a second pair of local input/output data lines (LIO2, LIO2B).

The bit line sense amplifier 10-1 may receive charges stored in a capacitor stored in a memory cell through a pair of bit lines BL and BLB and may amplify a voltage corresponding to the charges on the first and second pair of local input/output data lines (LIO1, LIO1B) an (LIO2, LIO2B).

The control signal generator 30 may receive external commands CMD and generate a first precharge control signal C1 and second precharge control signal P1. The level shifter 100 may receive the first precharge control signal C1 and generate a booted first precharge control signal C11 to be provided to the first precharger 600-1 and the third precharger 600-2. The first precharge voltage generator 40 may receive an external power supply voltage VEXT and may generate the first precharge voltage VINT. The second precharge voltage generator 50 may receive an external power supply voltage VEXT and may generate a second precharge voltage VBL.

The second precharge voltage VBL may be an external voltage level. The first precharge voltage VINT may be an internal power supply voltage level. The second precharge voltage VBL may be approximately ½ of the internal power supply voltage level.

The first precharger 600-1 may receive data signals transmitted to the first pair of local input/output data lines LIO1 and LIO1B during a data read operation, and may precharge the data signals of the first pair of local input/output data lines LIO1 and LIO1B to the first precharge voltage VINT in response to the boosted first precharge control signal C11. Then, the first precharger 600-1 may equalize the data signals at the first precharge voltage VINT.

The first precharger 600-1 may include a first precharge transistor Q_K1-1, a second precharge transistor Q_K1-2, and a first equalization transistor Q_K1-3. A drain of the first precharge transistor Q_K1-1 may be connected to the local input/output data line LIO1 and a drain of the second precharge transistor Q_K1-2 may be connected to the local/output data bar line LIOB. A source of the first precharge transistor Q_K1-1 may be connected to a source of the second precharge transistor Q_K1-2 such that the first precharge voltage VINT may be commonly applied to the sources of the first and second precharge transistors Q_K1-1 and Q_K1-2. A source of the first equalization transistor Q_k1-3 may be connected to the local input/output data line LIO1 and a drain of the first equalization transistor Q_K1-3 may be connected to the local input/output data bar line LIO1B. Gates of the first and second prechargers and first equalization transistors Q_K1-1 to Q_K1-3 may be commonly connected and controlled in response to the boosted first precharge control signal C11.

The second precharger 700-1 may receive the data signals transmitted to the first pair of local input/output data lines LIO1 and LIO1B during the data read operation, and may precharge the data signals of the first pair of local input/output data lines LIO1 and LIO1B to the second precharge voltage VBL in response to the second precharge control signal P1. Then, the second precharger 700-1 may equalize the data signals at the second precharge voltage VBL.

The second precharger 700-1 may include third and fourth precharge transistors Q_K2-1 and Q_K2-2 and a second equalization transistor Q_K2-3. A drain of the third precharge transistor Q_K2-1 may be connected to the local input/output data line LIO1 and a drain of the fourth precharge transistor Q_K2-2 may be connected to the local input/output data line LIO1B. A source of the third precharge transistor Q_K2-1 may be connected to a source of the fourth precharge transistor Q_K2-2 such that the second precharge voltage VBL may be commonly applied to the sources of the third and fourth precharge transistors Q_K2-1 and Q_K2-2. A source of the second equalization transistor Q_K2-3 may be connected to the local input/output data line LIO1, and a drain of the second equalization transistor Q_K2-3 may be connected to the local input/output data bar line LIO1B. Gates of the third and fourth precharge transistors and second equalization transistors Q_K2-1 to Q_K2-3 may be commonly connected and controlled in response to the second precharge control signal P1.

The first and second equalization transistors Q_K1-3 and Q_K2-3 may not be essential to the operation of the plurality of prechargers 600-1, 600-2, 700-1, and 700-2. Therefore, the prechargers 600-1, 600-2, 700-1, and 700-2 may be utilized without the first and second equalization transistors Q_K1-3 and Q_K2-3.

The details and operation of the bit line sense amplifier 10-2, the third and fourth prechargers 600-2 and 700-2 and the local input/output sense amplifier 80-2 are similar to the bit line sense amplifier 10-1, the first and second prechargers 600-1 and 700-1 and the local input/output sense amplifier 80-1, and are omitted for the sake of brevity.

In contrast to the conventional semiconductor memory devices described in the background section, all transistors of the plurality of prechargers 600-1, 600-2, 700-1 and 700-2 may include thick gate insulating layers. Also, the level shifter 100 may receive the first precharge control signal C1 from the control signal generator 30 to control the first and third prechargers 600-1 and 600-2. The level shifter 100 may output the boosted first precharge control signal C11. The level shifter may boost the voltage of the control signal C1 from the internal power supply voltage VINT level to the external power supply voltage VEXT level such that the boosted first precharge control signal includes the external power supply voltage VEXT level.

Due to the restriction of a threshold voltage, the first and second precharge transistors, and first equalization transistors Q_K1-l to Q_K1-3 with thick gate insulating layers according to example embodiments cannot be activated in response to the internal power supply voltage VINT. In other words, the first and second precharge transistors Q_K1-1 and Q_K1-2 of the first precharger 600-1 may be activated in response to the boosted first precharge control signal C11. The first precharge control signal C11 may be boosted to the external power supply voltage VEXT level. As a result, the first and second precharge transistors Q_K1-1 and Q_K1-2 may transmit the first precharge voltage VINT to the first pair of local input/output data lines LIO1 and LIO1B. Also, the first equalization transistor Q_K1-3 may be activated in response to the boosted first precharge control signal C11 and may equalize data signals transmitted to the pair of local input/output data lines LIO1 and LIO1B at the first precharge voltage VINT.

The local input/output sense amplifier 80-1 may receive the equalized data signals of the pair of local input/output data lines LIO1 and LIO1B, and may amplify voltage levels of the equalized data signals. The local input/output sense amplifier 80-1 may output the amplified data signals to a pair of global input/output data lines GIO1 and GIO1B.

Figure 5:
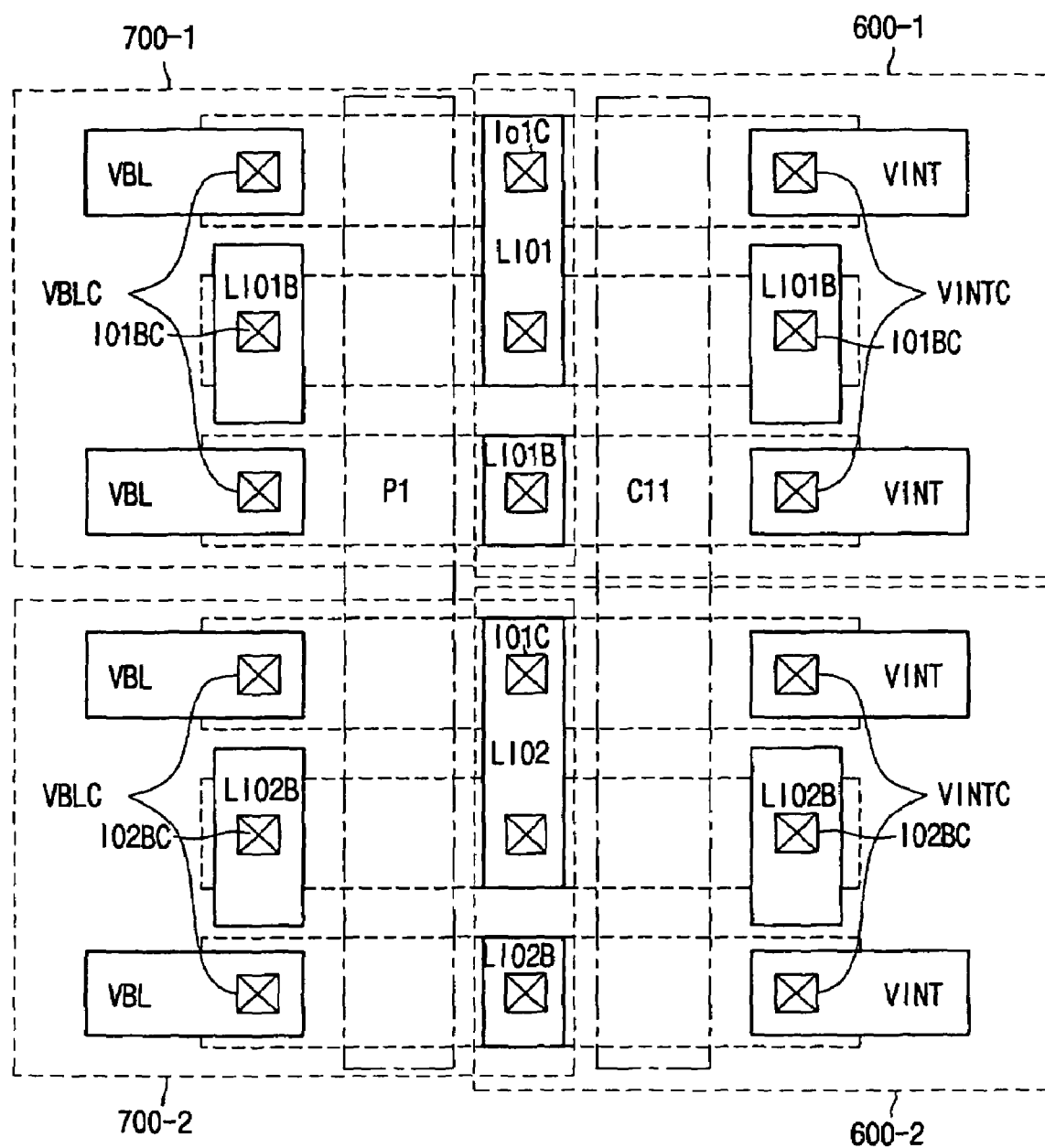
FIG. 5 illustrates a layout of a plurality of prechargers of first and second local input/output data lines of a semiconductor memory device according to example embodiments.

FIG. 5 illustrates layouts of the plurality of prechargers of FIG. 4 according to example embodiments.

Referring to FIG. 5, the plurality of prechargers may include the first precharger 600-1, the second precharger 700-1, third precharger 600-2, and the fourth precharger 700-2. The first precharger 600-1 and the second precharger 700-1 may be connected between the first pair of local input/output data lines (LIO1, LIO1B) and may precharge and equalize the first pair of local input/output data lines (LIO1, LIO1B) to the first precharge voltage VINT in response to the boosted control signal C11. The third precharger 600-2 and the fourth precharger 700-2 may be connected between the second pair of local input/output data lines (LIO2, LIO2B) and may precharge and equalize the second pair of local input/output data lines (LIO2, LIO2B) to the second precharge voltage VBL in response to the second control signal P1.

The first precharger 600-1 and the second precharger 700-1 may share a first active area. The first active action may include a first section 501, a second section 502, and a third section 503. The first active area may be disposed at a lower level than the local input/output data line LIO1, the local input/output data bar line LIO1B, a first precharge voltage line VINT and a second precharge voltage line VBL.

The first active area may be electrically connected to the local input/output data line LIO1 by an input/output data line contact IO1C and may be electrically connected to local input/output data bar line LIO1B by an input/output data bar line contact IO1BC. Also, the first active area may be may be electrically connected to the first precharge voltage line VINT by a first voltage line contact VINTC and electrically connected to the second precharge voltage line VNC by a second voltage line contact VBLC.

In the first section 501, the second precharge transistor Q_K1-2 may be arranged between the local input/output data line contact IO1C and the first precharge voltage line contact VINT. The fourth precharge transistor Q_K2-2 may be arranged between the local input/output data line contact IO1C and the second precharge voltage line contact VBLC. The second precharge transistor Q_k1-2 and the fourth precharge transistor Q_K2-2 may share the same local input/output data line contact IO1C.

In the second section 502, the first precharge transistor Q_K1-1 and the third precharge transistor Q_K2-1 may be arranged between the local input/output data line contact IO1C and the local input/output data bar line contact IO1BC. The first precharge transistor Q_K1-1 and the third precharge transistor Q_K2-1 may share the same local input/output data line contact IO1C.

In the third section 503, the first equalization transistor Q_k1-3 may be arranged between the local input/output data bar line contact IO1BC and the first precharge voltage line contact VINTC. The second equalization transistor Q_K2-3 may be arranged between the local input/output data bar line contact IO1BC and the second precharge voltage line contact VBLC. The first equalization transistor Q_K1-3 and the second equalization transistor Q_K2-3 may share the same local input/output line data bar line contact IO1BC.

The third precharger 600-2 and the fourth precharger may share a second active area. Since the second active area and the connections thereof are similar to the first active area, a detailed discussion will be omitted for the sake of brevity.

The first and second precharge control signal lines C11 and P1 may be arranged on the first and second active area. For example, the first and second precharge control signal lines C11 and P1 may be extended and connected to all the plurality of prechargers 600-1, 700-1, 600-2, and 700-2 arranged between the first and second pairs of local input/output data lines (LIO1, LIO1B) and (LIO2, LIO2B). More specifically, the first boosted precharge control signal C11 may be arranged on the first and second active areas by extending the first precharge control signal line from the first precharger 600-1 to the third precharger 600-2. Also, the second precharge control signal P1 may be arranged on the first and second active areas by extending the second precharge control signal P1 from the second precharger 700-1 to the fourth precharger 700-2.

According to example embodiments the first, second, third and fourth precharge transistors and first and second equalization transistors Q_K1-1 to Q_K1-3 and Q_K2-1 to Q_K2-3 of the plurality of prechargers 600-1, 700-1, 600-2, and 700-2 may not be separately arranged in different sections but share the same regions. As a result, the semiconductor memory device may increase the integration density of the conventional semiconductor memory device.

However, in order that the first and second prechargers 600-1, 700-1, 600-2, and 700-2 share the active area at the lower level, gate oxide layers of the transistors Q_K1-1 to Q_K1-3 and Q_K2-1 to Q_K2-3 must have the same thickness, and all logic high levels of the first and second precharge control signals C11 and P1 for driving the transistors Q_K1-1 to Q_K1-3 and Q_K2-1 to Q_K2-3 must be an external voltage level.

Therefore, according to example embodiments, the layout of a plurality of prechargers of local input/output data lines may be improved. For instance, when the number of memory cell array blocks is reduced, blocks related to the local input/output data lines may be adaptively arranged in the reduced number of memory cell array blocks, thereby reducing the area of a memory core and the fabrication cost of the semiconductor memory device.

Example embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure.

What is claimed is:

1. A layout method of a semiconductor memory device including a level shifter configured to receive a first precharge control signal and boost a logic high level of the first precharge control signal to an external power supply voltage level to output a boosted first precharge control signal, first and third prechargers configured to receive a first precharge voltage and precharge data signals transmitted to a first and second pair of local input/output data lines to the first precharge voltage in response to the boosted first precharge control signal during a data read operation, and second and fourth prechargers configured to receive a second precharge voltage to precharge the data signals transmitted to the first and second pair of local input/output data lines to the second precharge voltage in response to the second precharge control signal during a precharge operation, the method comprising:
sharing a first active area between the first precharger and the second precharger and sharing a second active area between the third precharger and the fourth precharger.

2. The method of claim 1, wherein,
each of the first and third prechargers includes first and second precharge transistors serially connected between a corresponding pair of the first and second pairs of local data input/output lines to precharge the first precharge voltage,
each of the second and fourth prechargers includes third and fourth precharge transistors serially connected between corresponding pair of the third and fourth pairs of local data input/output lines to precharge the second precharge voltage,
sharing the first active area between the first precharger and the second precharger includes sharing the first active region of the first precharge transistors of the first precharger and the second precharger, and sharing the first active region of the second precharge transistors of the first precharger and the second precharger; and
sharing the second active area between the third precharger and the fourth precharger includes sharing the first active region of the third precharge transistors of the third precharger and the fourth precharger, and sharing the first active region of the fourth precharge transistors of the third precharger and the fourth precharger.

3. The method of claim 2, wherein,
each of the first and third prechargers further include a first equalization transistor connected between corresponding pairs of the first and second pairs of local data input/output lines to equalize the corresponding pair of the first and second pairs of local data input/output lines,
each of the second and fourth prechargers further includes a second equalization transistor connected between corresponding pair of the first and second pairs of local data input/output lines to equalize the corresponding pair of the first and second pairs of local data input/output lines,
sharing the first active area between the first precharger and the second precharger further includes sharing the first active region of the first equalization transistors of the first precharger and the second precharger, and
sharing the second active area between the third precharger and the fourth precharger further includes sharing the first active region of the second equalization transistors of the third precharger and the fourth precharger.

4. The method of claim 3, further comprising:
electrically connecting each of the first and second active areas to a local input/output data line of the first and second input/output data lines by an input/output data line contact, a local input/output data bar line of the first and second input/output data lines by input/output data bar line contact, a first precharge voltage line by a first precharge voltage line contact, and a second precharge voltage line by a second precharge voltage line contact.

5. The method of claim 4, wherein sharing each of the first and second active areas includes:
arranging the second precharge transistor between the local input/output data line contact and the first precharge voltage line contact, and the fourth precharge transistor between the local input/output data line contact and the second precharge voltage line contact, wherein the second and fourth precharge transistors share the same local input/output data line contact;
arranging the first and third precharge transistors between the local input/output data line contact and the local input/output data bar line contact, wherein the first and third precharge transistors share the same local input/output data line contact; and arranging the first equalization transistor between the local input/output data bar line contact and the first precharge voltage line contact, and the second equalization transistor between the local input/output data bar line contact and the second precharge voltage line contact, wherein the first and second equalization transistors share the same local input/output data bar line contact.

6. The method of claim 2, further comprising:

boosting the first precharge control signal to a boosted first precharge control signal, wherein a level of the boosted first precharge control signal is an external power supply voltage level.

7. The method of claim 2, further comprising:

arranging the first and second precharge control signal on the first and second active area, the first precharge control signal being extended to the first and third prechargers, the second precharge control signal being extended to the second and fourth prechargers.

8. The method according to claim 3, wherein the first and second equalization transistors and the first through fourth precharge transistors include insulating layers of the same thickness.

9. A semiconductor memory device comprising:

a level shifter configured to receive a first precharge control signal and boost a logic high level of the first precharge control signal to an external power supply voltage level to output a boosted first precharge control signal;

first and third prechargers configured to receive a first precharge voltage and precharge data signals transmitted to a first and second pair of local input/output data lines to the first precharge voltage in response to the boosted first precharge control signal during a data read operation; and second and fourth prechargers configured to receive a second precharge voltage to precharge the data signals transmitted to the first and second pair of local input/output data lines to the second precharge voltage in response to the second precharge control signal during a precharge operation.

10. The semiconductor memory device of claim 9, further comprising:

a control signal generator configured to receive commands to generate the first precharge control signal and the second precharge control signal;

a first and second precharge voltage generator configured to receive a power supply voltage and the generate first and second precharge voltages, respectively.

11. The semiconductor memory device of claim 9, wherein each of the first and third prechargers includes first and second precharge transistors connected in series between the first and second pair of local input/output data lines, and a first equalization transistor, each of the second and fourth prechargers includes third and fourth precharge transistors connected in series between the first and second pair of local input/output data lines and a second equalization transistor.

12. The semiconductor memory device of claim 11, wherein each of the first and second precharge transistors includes a gate configured to receive the first boosted precharge control signal and a common source configured to receive the first precharge voltage.

13. The semiconductor memory device of claim 11, wherein each of the third and fourth precharge transistors includes a gate configured to receive the second precharge control signal and a common source configured to receive the second precharge voltage.

14. The semiconductor memory device of claim 11, wherein the first equalization transistor is configured to equalize the first precharge voltage on the first and second pair of local input/output data lines in response to receiving the booted first precharge control signal.

15. The semiconductor memory device of claim 11, wherein the second equalization transistor is configured to equalize the second precharge voltage on the first and second pair of local input/output data lines in response to receiving the second precharge control signal.

16. The semiconductor memory device of claim 11, wherein a first active area is shared between the first and second prechargers and a second active area is shared between the second and fourth prechargers.

17. The semiconductor memory device of claim 16, wherein each of the first and second active area is connected to a local input/output data line of the first and second input/output data lines by an input/output data line contact, a local input/output data bar line of the first and second input/output data lines by an input/output data bar line contact, a first precharge voltage line by a first precharge voltage line contact, and a second precharge voltage line by a second precharge voltage line contact.

18. The semiconductor memory device of claim 17, wherein each of the first and second active area includes:

a first section including the second precharge transistor arranged between the local input/output data line contact and the first precharge voltage line contact, and the fourth precharge transistor arranged between the local input/output data line contact and the second precharge voltage line contact, wherein the second and fourth precharge transistors may share the same local input/output data line contact;

a second section includes the first and third precharge transistors arranged between the local input/output data line contact and the local input/output data bar line contact, wherein the first and third precharge transistors share the same local input/output data line contact; and a third section includes the first equalization transistor arranged between the local input/output data bar line contact and the first precharge voltage line contact, and the second equalization transistor arranged between the local input/output data bar line contact and the second precharge voltage line contact, wherein the first and second equalization transistors share the same local input/output data bar line contact.

19. The semiconductor memory device of claim 16, wherein the first precharge control signal is arranged on the first and second active area, the first precharge control signal being extended to the first and third prechargers.

20. The semiconductor memory device of claim 16, wherein the second precharge control signal is arranged on the first and second active area, the second precharge control signal being extended to the second and fourth prechargers.

21. The semiconductor memory device of claim 11, wherein the first and second equalization transistors and the first through fourth precharge transistors include insulating layers of the same thickness.

22. The semiconductor memory device of claim 9, wherein the first precharge voltage is an internal power supply voltage, and the second precharge voltage is ½ the internal power supply voltage.

23. The semiconductor memory device of claim 22, wherein a logic high level of the first precharge control signal is a level of the internal power supply voltage, and a logic high level of the second precharge control signal is a level of the external power supply voltage.

24. The semiconductor memory device of claim 9, further comprising:

a plurality of bit line sense amplifiers configured to receive charges stored in a memory cell through a plurality of bit lines and amplify a voltage corresponding to the charges to output the amplified voltage; and a plurality of local input/output sense amplifiers configured to receive the data signals transmitted to the first and second pairs of local input/output data lines during the data read operation and amplify voltage levels of the data signals to output the amplified data signals to pairs of first and second global input/output data lines.

* * * * *